United States Patent
Mizusaki

(10) Patent No.: US 11,917,858 B2
(45) Date of Patent: Feb. 27, 2024

(54) DISPLAY DEVICE INCLUDING MOLYBDENUM AND POLYPHENYLENEW SULFIDE CONTAINING THERMAL INSULATION LAYER

(71) Applicant: SHARP KABUSHIKI KAISHA, Sakai (JP)

(72) Inventor: Masanobu Mizusaki, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 309 days.

(21) Appl. No.: 17/272,649

(22) PCT Filed: Sep. 6, 2018

(86) PCT No.: PCT/JP2018/032977
§ 371 (c)(1),
(2) Date: Mar. 1, 2021

(87) PCT Pub. No.: WO2020/049674
PCT Pub. Date: Mar. 12, 2020

(65) Prior Publication Data
US 2021/0343971 A1    Nov. 4, 2021

(51) Int. Cl.
*H10K 50/84* (2023.01)
*H10K 50/87* (2023.01)
*H10K 50/844* (2023.01)
*H10K 59/121* (2023.01)
*H10K 59/124* (2023.01)

(52) U.S. Cl.
CPC .......... *H10K 50/87* (2023.02); *H10K 50/841* (2023.02); *H10K 50/844* (2023.02); *H10K 59/1213* (2023.02); *H10K 59/124* (2023.02)

(58) Field of Classification Search
CPC .... H10K 50/87; H10K 50/841; H10K 50/844; H10K 59/1213; H10K 59/12; G06F 9/30; H05B 33/02; H05B 33/04
See application file for complete search history.

(56) References Cited

U.S. PATENT DOCUMENTS

| | | | |
|---|---|---|---|
| 2004/0124766 A1* | 7/2004 | Nakagawa | H10K 85/6574 313/506 |
| 2006/0022589 A1* | 2/2006 | Cok | H10K 50/87 313/506 |
| 2007/0058101 A1* | 3/2007 | Kawasaki | G02F 1/1368 349/123 |

(Continued)

FOREIGN PATENT DOCUMENTS

| | | | | |
|---|---|---|---|---|
| JP | 2010147179 A | | 7/2010 | |
| KR | 20160119004 A | * | 10/2016 | H05K 7/20481 |

(Continued)

*Primary Examiner* — Ida M Soward
(74) *Attorney, Agent, or Firm* — ScienBiziP, P.C.

(57) ABSTRACT

The display device includes a light-emitting element layer provided with a plurality of light-emitting elements, and a TFT layer that is provided below the light-emitting element layer and includes TFT configured to drive the plurality of light-emitting elements. Further, at least one thermal insulation layer configured to thermally insulate the plurality of light-emitting elements from external heat is provided, and the thermal insulation layer includes a molybdenum-containing complex and a polyphenylene sulfide-based resin.

12 Claims, 10 Drawing Sheets

(56) References Cited

U.S. PATENT DOCUMENTS

| | | | | |
|---|---|---|---|---|
| 2009/0124838 A1* | 5/2009 | Haramoto | ............... | H10K 85/60 |
| | | | | 585/435 |
| 2010/0013372 A1* | 1/2010 | Oikawa | ................. | H10K 71/80 |
| | | | | 313/498 |
| 2010/0066951 A1* | 3/2010 | Kuo | ................... | G02F 1/133305 |
| | | | | 349/160 |
| 2010/0171138 A1* | 7/2010 | Yamazaki | ............... | H05B 33/12 |
| | | | | 257/98 |
| 2013/0143336 A1* | 6/2013 | Jain | ......................... | H01L 33/06 |
| | | | | 438/22 |
| 2014/0151655 A1* | 6/2014 | Ahn | ...................... | H10K 50/805 |
| | | | | 438/26 |
| 2015/0069366 A1* | 3/2015 | Lunt | ....................... | H10K 50/11 |
| | | | | 257/40 |
| 2017/0110681 A1* | 4/2017 | Shen | ..................... | H10K 50/844 |
| 2018/0375055 A1* | 12/2018 | Tu | ....................... | H05K 7/20963 |
| 2019/0198809 A1* | 6/2019 | Guo | ................... | H10K 50/8445 |

FOREIGN PATENT DOCUMENTS

| | | | | |
|---|---|---|---|---|
| WO | WO-2014020984 A1 * | 2/2014 | ............ | C07D 263/56 |
| WO | WO-2017221549 A1 * | 12/2017 | ............. | H10K 50/00 |

\* cited by examiner

DISPLAY DEVICE INCLUDING MOLYBDENUM AND POLYPHENYLENEW SULFIDE CONTAINING THERMAL INSULATION LAYER

TECHNICAL FIELD

The disclosure relates to a display device provided with a thermal insulation layer.

BACKGROUND ART

Light-emitting elements used in various display devices have low heat resistance, and the light emission luminance thereof is easily reduced in a high temperature environment.

Therefore, as described in PTL1 for example, providing a heat dissipating layer on a surface of a support substrate of a display device has been proposed for known display devices.

CITATION LIST

Patent Literature

PTL1: JP 2010-147179 A (published on Jul. 1, 2010)

SUMMARY

Technical Problem

However, a problem that occurs when a known display device like that described above is used in a high temperature environment such as, for example, in an in-vehicle application, is that the heat dissipating layer does not function properly, and thus it is difficult to prevent deterioration of the light-emitting element due to heat generated by the light-emitting element.

In light of the foregoing problem, an object of the disclosure is to provide a display device that can retard the degradation of a light-emitting element even when used in a high temperature environment.

Solution to Problem

A display device according to an aspect of the disclosure includes: a light-emitting element layer provided with a plurality of light-emitting elements; and a TFT layer provided below the light-emitting element layer and including TFT configured to drive the plurality of light-emitting elements; wherein at least one thermal insulation layer configured to thermally insulate the plurality of light-emitting elements from external heat is provided, and the thermal insulation layer includes a molybdenum-containing complex and a polyphenylene sulfide-based resin.

Advantageous Effects of Disclosure

According to one aspect of the disclosure, a display device can be provided which can retard the degradation of light-emitting elements even when the display device is used in a high temperature environment.

DESCRIPTION OF EMBODIMENTS

General Description of Manufacturing Method and Configuration of Display Device

A method of manufacturing a display device according to an embodiment of the disclosure will be described in detail below with reference to FIG. 1 and FIG. 2. Note that hereinafter, "the same layer" means that the layer is formed in the same process (film formation step), "a lower layer" means that the layer is formed in an earlier process than the process in which the layer to be compared is formed, and "an upper layer" means that the layer is formed in a later process than the process in which the layer to be compared is formed.

Figure 1:
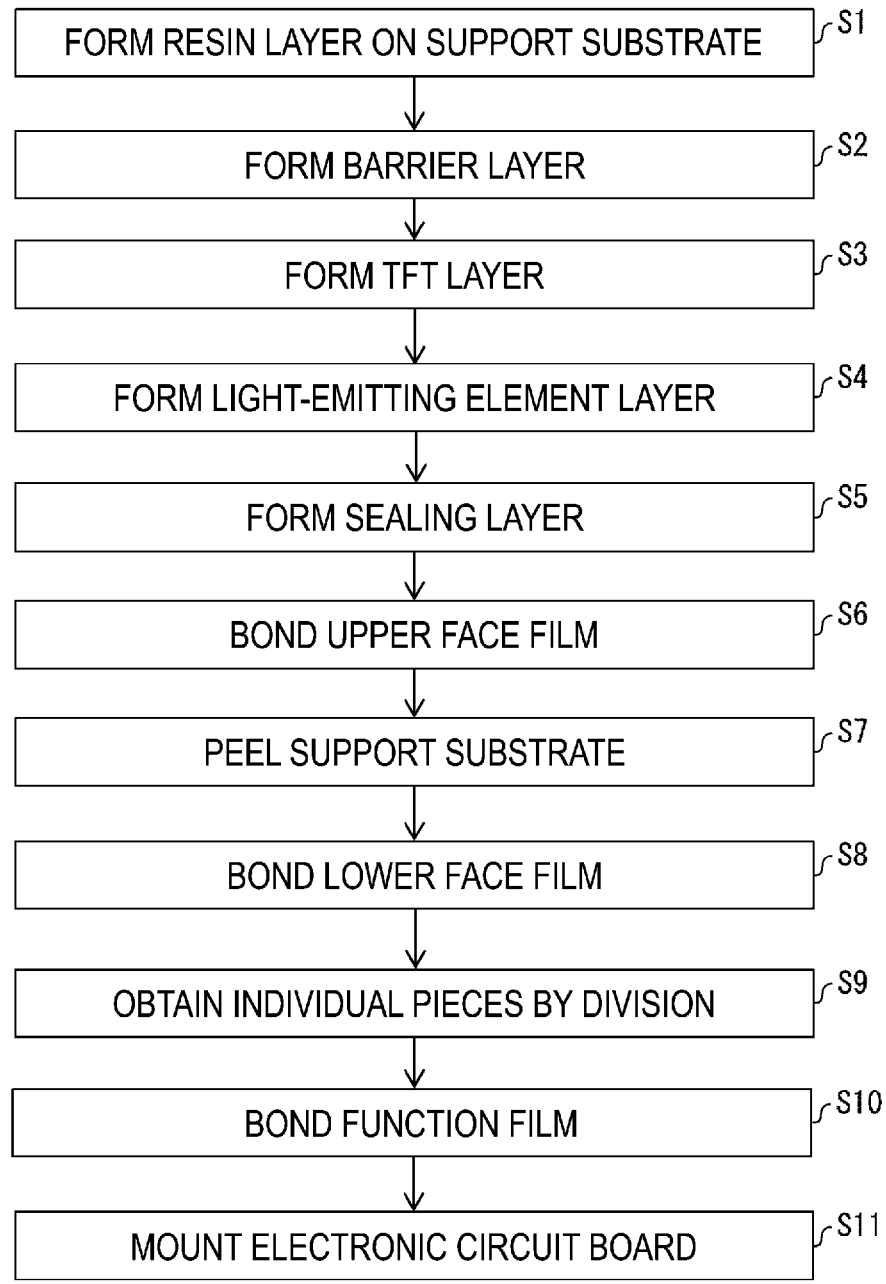
FIG. 1 is a flowchart illustrating an example of a method of manufacturing a display device.

FIG. 1 is a flowchart illustrating an example of a method of manufacturing a display device. FIG. 2 is a cross-sectional view illustrating a configuration of a display region of a display device.

Figure 2:
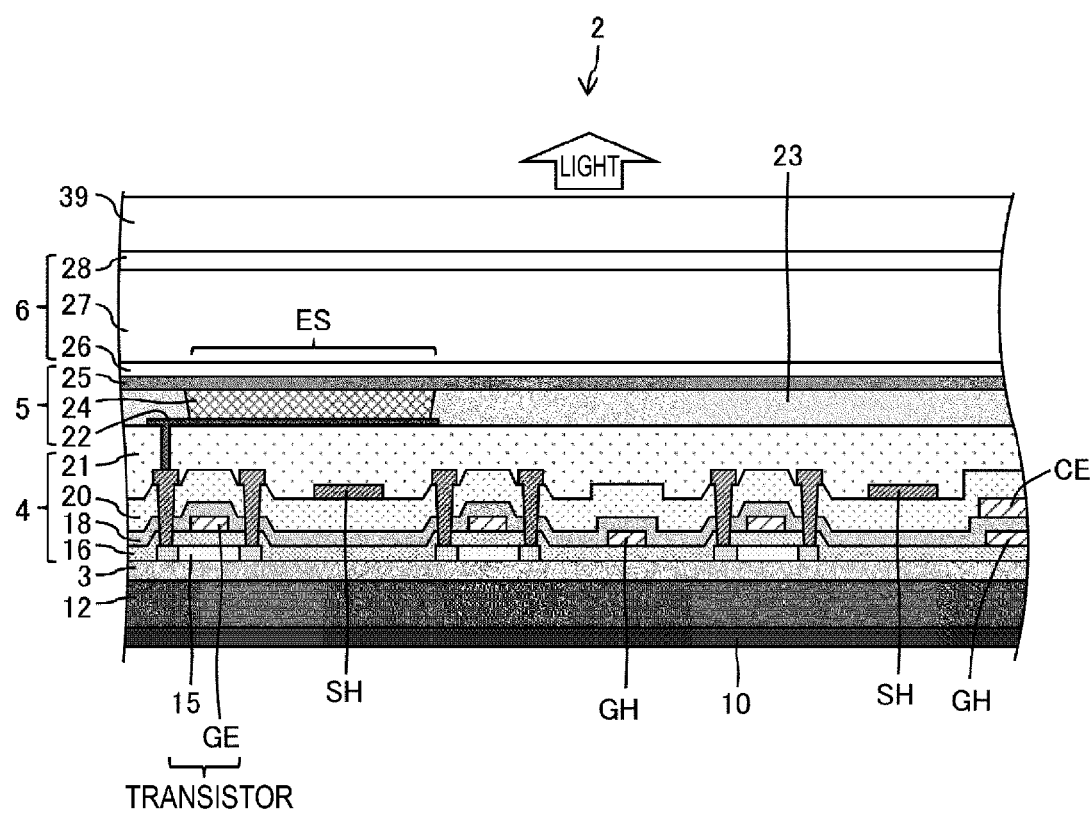
FIG. 2 is a cross-sectional view illustrating a configuration of a display region of a display device.

In a case where a flexible display device is manufactured, as illustrated in FIG. 1 and FIG. 2, first, a resin layer 12 is formed on a light-transmissive support substrate (a mother glass, for example) (step S1). Next, a barrier layer 3 is formed as a moisture-proof film covering the resin layer (step S2). Next, a TFT layer 4 is formed (step S3). Next, a top-emitting type light-emitting element layer 5 is formed (step S4). Next, a sealing film 6 is formed (step S5). Next, an upper face film 39 is bonded to the sealing film 6 (step S6).

Next, the support substrate is peeled from the resin layer 12 due to irradiation with a laser light or the like (step S7). Next, a lower face film 10 is bonded to the lower face of the resin layer 12 (step S8). Next, a layered body including the lower face film 10, the resin layer 12, the barrier layer 3, the TFT layer 4, the light-emitting element layer 5, and the sealing film 6 is divided and a plurality of individual pieces are obtained (step S9). Next, a function film is bonded on the obtained individual pieces (step S10). Next, an electronic circuit board (for example, an IC chip or an FPC) is mounted on a portion (terminal portion) of the display region located further outward (a non-display region or a frame) than a portion where a plurality of subpixels are formed (step S11). Note that steps S1 to S11 are executed by a display device manufacturing apparatus (including a film formation apparatus that executes the process from step S1 to S5).

Examples of the material of the resin layer 12 include a polyimide (PI). A portion of the resin layer 12 can be replaced by two resin films (for example, polyimide films) with an inorganic insulating film sandwiched therebetween.

The barrier layer 3 is a layer that inhibits foreign matter such as water and oxygen from entering the TFT layer 4 and the light-emitting element layer 5, and can be constituted by a silicon oxide film, a silicon nitride film, or a silicon oxynitride film, or by a layered film of these, formed by chemical vapor deposition (CVD).

The TFT layer 4 includes a semiconductor film 15, an inorganic insulating film 16 (gate insulating film) in an upper layer than the semiconductor film 15, a gate electrode GE and a gate wiring line GH in an upper layer than the inorganic insulating film 16, an inorganic insulating film 18 in an upper layer than the gate electrode GE and a gate wiring line GH, a capacitance electrode CE in an upper layer than the inorganic insulating film 18, an inorganic insulating film 20 in an upper layer than the capacitance electrode CE, a source wiring line SH in an upper layer than the inorganic insulating film 20, and a flattening film 21 (interlayer insulating film) in an upper layer than the source wiring line SH.

The semiconductor film 15 is constituted of, for example, a low-temperature polysilicon (LTPS) or an oxide semiconductor (for example, an In—Ga—Zn—O based semiconductor), and a transistor (TFT) is configured to include the semiconductor film 15 and the gate electrode GE. FIG. 2 illustrates the transistor that has a top gate structure, but the transistor may have a bottom gate structure.

The gate electrode GE, the gate wiring line GH, the capacitance electrode CE, and the source wiring line SH are each composed of a single layer film or a layered film of a metal, for example, including at least one of aluminum, tungsten, molybdenum, tantalum, chromium, titanium, and copper, for example. The TFT layer 4 in FIG. 2 includes a single layer of a semiconductor layer and three layers of metal layers.

Each of the inorganic insulating films 16, 18, and 20 can be formed of, for example, a silicon oxide (SiOx) film or a silicon nitride (SiNx) film, or a layered film of these, formed by using a CVD method. The flattening film 21 can be formed of, for example, a coatable organic material such as polyimide or acrylic.

The light-emitting element layer 5 includes an anode 22 in an upper layer overlying the flattening film 21, an edge cover 23 having insulating properties and covering an edge of the anode 22, an electroluminescent (EL) layer 24 in an upper layer overlying the edge cover 23, and a cathode 25 in an upper layer overlying the EL layer 24. The edge cover 23 is formed by applying an organic material such as a polyimide or an acrylic and then patterning the organic material by photolithography, for example.

For each subpixel, light-emitting elements ES including island shaped anodes 22, EL layers 24, and a cathode 25 (for example, an organic light-emitting diode (OLED), quantum dot diode (QLED)) are formed in the light-emitting element layer 5, and subpixel circuits for controlling the light-emitting elements ES are formed in the TFT layer 4.

For example, the EL layers 24 are formed by layering a hole injection layer, a hole transport layer, a light-emitting layer, an electron transport layer, and an electron injection layer in this order, from the lower layer side. The light-emitting layer is formed into an island shape at an opening of the edge cover 23 (on a subpixel-by-subpixel basis) by vapor deposition or an ink-jet method. Other layers are formed in an island shape or a solid-like shape (common layer). A configuration is also possible in which one or more layers are not formed among the hole injection layer, the hole transport layer, the electron transport layer, and the electron injection layer.

When the light-emitting layer of the OLED is formed by vapor deposition, a fine metal mask (FMM) is used. The FMM is a sheet with a large number of openings (for example, made of Invar material), and an island-shaped light-emitting layer (corresponding to one subpixel) is formed of an organic material passing through one of the openings.

With the light-emitting layer of the QLED, for example, an island-shaped light-emitting layer (corresponding to one subpixel) can be formed by ink-jet coating a solvent having quantum dots diffused therein.

The anode (anode electrode) 22 is formed by a layering of indium tin oxide (ITO) and silver (Ag) or an alloy containing Ag, for example, and has light reflectivity. The cathodes (cathode electrode) 25 can be constituted by a transparent conductive material such as a MgAg alloy (extremely thin film), ITO, or IZO (indium zinc oxide).

In a case where the light-emitting element ES is an OLED, positive holes and electrons recombine inside the light-emitting layer in response to a drive current between the anode 22 and the cathode 25, and light is emitted when the excitons generated in this manner transition to a ground state. Because the cathode 25 is transparent and the anode 22 has light reflectivity, the light emitted from the EL layer 24 travels upward and becomes top-emitting.

In a case where the light-emitting element ES is a QLED, positive holes and electrons recombine inside the light-emitting layer in response to a drive current between the anode 22 and the cathode 25, and light (fluorescence) is emitted when the excitons generated in this manner transition from the conduction band of the quantum dot to the valence band.

A light-emitting element (such as an inorganic light-emitting diode) other than an OLED or QLED may be formed in the light-emitting element layer 5.

The sealing film 6 is transparent, and includes an inorganic sealing film 26 (first inorganic insulating layer) covering the cathode 25, and an organic buffer film 27 (organic insulating layer) and an inorganic sealing film 28 (second inorganic insulating layer) as upper layers further above the inorganic sealing film 26. The sealing film 6 covering the light-emitting element layer 5 prevents foreign matter, such as water and oxygen, from penetrating into the light-emitting element layer 5.

The inorganic sealing film 26 and the inorganic sealing film 28 are both inorganic insulating layers and can be configured of, for example, a silicon oxide film, a silicon nitride film, a silicon oxynitride film, or a layered film of these, formed through CVD. The organic buffer film 27 is a transparent organic insulating layer having a flattening effect and can be formed of a coatable organic material such as an acrylic. The organic buffer film 27 can be formed, for example, by ink-jet application, and a bank for stopping droplets may be provided in the non-display region. The inorganic sealing film 26, the organic buffer film 27, and the inorganic sealing film 28 are layered in this order from the light-emitting element layer 5 side.

The lower face film 10 is, for example, a PET film which, after the support substrate has been peeled off, is bonded on the lower face of the resin layer 12 through an adhesive layer 51 (FIG. 3 described below) to thereby achieve a display device with excellent flexibility. The function film has, for example, at least one of an optical compensation function, a touch sensor function, and a protection function.

A flexible display device was described above, but when a non-flexible display device is to be manufactured, ordinarily, the formation of a resin layer, and the replacement of the base material, etc. are not required, and therefore, for example, the processes of layering on a glass substrate of steps S2 to step S5 are implemented, after which the manufacturing process moves to step S9.

Hereinafter, in each embodiment, an example of the structure of the display device 2 will be described. However, in each embodiment, points that are similar to those described in a previously described embodiment will be omitted in the embodiments described later.

First Embodiment

Figure 3:
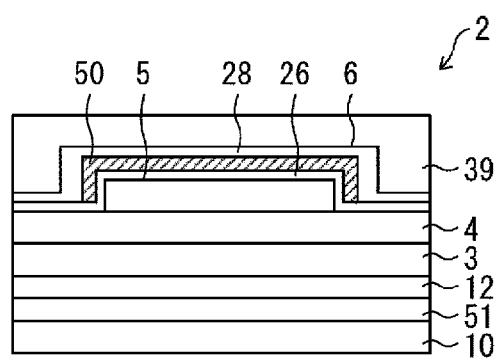
FIG. 3 is cross-sectional view illustrating a general configuration of a display device according to a first embodiment.

FIG. 3 is cross-sectional view illustrating a general configuration of a display device 2 according to the present embodiment.

For example, as illustrated in FIG. 3, the display device 2 according to the present embodiment is provided with a thermal insulation layer 50 configured to thermally insulate the light-emitting element layer 5 from external heat, the thermal insulation layer 50 being provided in a peripheral portion of each of the plurality of light-emitting elements ES. The display device 2 illustrated in FIG. 3 uses the thermal insulation layer 50 as the organic buffer film 27 of the sealing film 6 covering the light-emitting element layer 5 of the display device 2 illustrated in FIG. 2. In other words, in the present embodiment, the organic buffer film 27 is the thermal insulation layer 50, and functions as an organic buffer film and also as a thermal insulation layer.

The thermal insulation layer 50 includes a molybdenum-containing complex (hereinafter, referred to as a "molybdenum complex") and a polyphenylene sulfide-based resin (polyphenylene sulfides), which is a binder resin (matrix resin). The molybdenum complex is dispersed in the polyphenylene sulfide-based resin.

Examples of the polyphenylene sulfide-based resin include polyphenylene sulfide, polyphenylene sulfide derivatives, and polyphenylene sulfide copolymers.

Examples of the polyphenylene sulfide include poly(p-phenylene sulfide) having a repeating structure represented by the structural formula (1) below in the main chain.

[Chemical Formula 1]

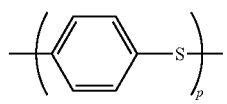
(1)

(Wherein, p represents an integer of from 10 to 10000.)

If the degree of polymerization is too low, heat resistance is not sufficient, and if the degree of polymerization is too high, the viscosity becomes too high when forming a film using a solution coating method such as an ink-jet method, and film thickness control becomes difficult. Therefore, in the above structural formula (1), the number of repetitions indicated by p is preferably in a range of from 10 to 10000, and more preferably in a range of from 50 to 5000.

Furthermore, examples of the polyphenylene sulfide derivative include poly(p-phenylene sulfide) derivatives having, in the main chain, a repeating structure represented by structural formula (2) below.

[Chemical Formula 2]

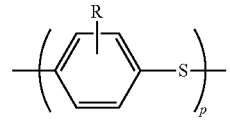
(2)

(Wherein, R represents an alkyl group having from 1 to 20 carbons, an alkyloxy group, an alkylamino group, or an alkylene group, and p represents an integer of 10 to 10000.)

If the degree of polymerization is too low, heat resistance is not sufficient, and if the degree of polymerization is too high, the viscosity becomes too high when forming a film using a solution coating method such as an ink-jet method, and film thickness control becomes difficult. Therefore, in the above structural formula (2), the number of repetitions indicated by p is preferably in a range of from 10 to 10000, and more preferably in a range of from 50 to 5000.

Furthermore, examples of the polyphenylene sulfide copolymers include block copolymers of p-phenylene sulfide, and random copolymers of p-phenylene sulfide, and for example, the polyphenylene sulfide copolymer may include a p-phenylene sulfide unit as a main repeating unit and an m-phenylene sulfide unit as a copolymerization unit.

The polyphenylene sulfide-based resin is preferably transparent, and when the polyphenylene sulfide-based resin is a polyphenylene sulfide copolymer, examples of the copolymer component include (meth)acrylic acid-based polymers or (meth)acrylic acid-based monomers (i.e., acrylic acid-based polymers, acrylic acid-based monomers, methacrylic acid-based polymers, and methacrylic acid-based monomers).

Furthermore, if the degree of polymerization is too low, heat resistance is not sufficient, and if the degree of polymerization is too high, the viscosity becomes too high when forming a film using a solution coating method such as an ink-jet method, and film thickness control becomes difficult. Therefore, the weight average molecular weight of the polyphenylene sulfide-based resin is preferably in a range of from 1000 to 1500000, and more preferably in a range of from 5000 to 500000.

Polyphenylene sulfide-based resins such as polyphenylene sulfide are more rigid, have higher heat resistance, are less prone to molecular vibration than vinyl-based resins. For example, polyphenylene sulfide has a heat resistance of 100° C. or higher, and does not undergo any conformational changes even in environments of 100° C. or higher. The general level of high temperature resistance that is required in the harshest in-vehicle applications is 95° C., and thus polyphenylene sulfide having a thermal resistance of 100° C. or higher is suitable as a binder resin (matrix resin). Furthermore, the polyphenylene sulfide-based resin can be formed into a film by a solution coating method such as an ink-jet method.

The molybdenum complex is a coordination compound that includes molybdenum (molybdenum atom) as a central metal and has a ligand (ligand) bonded to the molybdenum. The ligand is not particularly limited, but preferably contains sulfur (sulfur atom).

Examples of the sulfur complex of molybdenum, the complex thereof containing sulfur in the ligand, include [MoFe$_3$S$_6$(CH$_3$)$_5$] and [MoFe$_2$S$_5$(CH$_3$)$_5$] having the respective structures shown below.

[Chemical Formula 3]

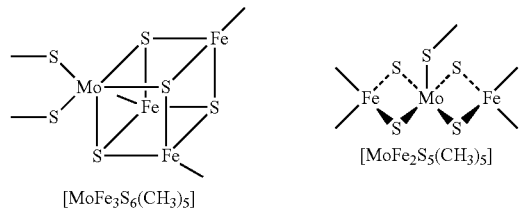

[MoFe$_3$S$_6$(CH$_3$)$_5$]  [MoFe$_2$S$_5$(CH$_3$)$_5$]

The sulfur complex of molybdenum exhibits good miscibility with the polyphenylene sulfide-based resin having sulfur (a sulfur atom) in the skeleton structure, and can be uniformly dispersed in the polyphenylene sulfide-based resin. Therefore, a thermal insulation layer 50 with a higher thermal insulation effect can be obtained by using the sulfur complex of molybdenum as the molybdenum complex. Thus, thermal degradation of the light-emitting element ES can be further suppressed in applications where high heat resistance is required, such as, for example, in-vehicle applications.

In the thermal insulation layer 50, the content percentage of the molybdenum complex relative to the polyphenylene sulfide-based resin is preferably within a range of from 3 to 7 wt. %. When the molybdenum complex is mixed in the aforementioned range with respect to the polyphenylene sulfide-based resin, a sufficient thermal insulating effect can be obtained, and a thermal insulation layer 50 with high transmittance can be obtained without the effects of scattering or the like. Therefore, according to the above-described configuration, a display device 2 that excels in brightness characteristics and can retard the degradation of the light-emitting elements ES can be provided. Note that when the content percentage of the molybdenum complex is less than 3 wt. %, the thermal insulation effect is reduced. On the other hand, when the content percentage of the molybdenum complex exceeds 7 wt. %, the display characteristics of the display device 2 may decrease due to the effects of scattering or the like.

The thickness of the thermal insulation layer 50 is not particularly limited, and is preferably from 20 nm to 1000 nm in order to configure the thermal insulation layer 50 such that the thermal insulation effect is not excessively reduced due to a decrease in the film thickness, and such that the light intensity is not decreased due to an increase in the film thickness. Moreover, from the perspectives of ensuring the thermal insulation effect and suppressing a decrease in light intensity, the thickness of the thermal insulation layer 50 is more preferably from 100 nm to 300 nm.

The thermal insulation layer 50 can be formed, for example, by adding a molybdenum complex into a solution obtained by dissolving a polyphenylene sulfide-based resin in a solvent, uniformly mixing the mixed solution with good agitation, and then coating the resulting mixture onto a layer that becomes an underlayer and baking to remove (evaporate) the solvent.

The degradation of the light-emitting element ES is much greater when the light-emitting element ES is operated in a high temperature environment than when the light-emitting element ES is simply placed in a high temperature environment. Therefore, the boiling point of the solvent, the baking temperature, and the baking time are not particularly limited.

Accordingly, the solvent described above may be any organic solvent capable of dissolving the polyphenylene sulfide-based resin. However, it is more desirable to use an organic solvent with as low a boiling point as possible in order to reduce damage to the light-emitting element ES due to heat and to shorten the time required to form the thermal insulation layer 50. Examples of the solvent include N-methyl-2-pyrrolidone (NMP), butyl cellosolve, toluene, and chloroform.

Furthermore, the baking temperature and the baking time for removing the solvent are not particularly limited, and may be set, as appropriate, in accordance with the type and amount of the solvent. As an example, after being coated with the abovementioned mixed solution, the substrate is first temporarily dried for 5 minutes, for example, at a temperature of approximately 90° C., for example, and then subjected to a main baking for 5 minutes, for example, in an oven at, for example, 140° C.

The main baking temperature is not particularly limited as long as it is a temperature at which the solvent evaporates, and is preferably from 140° C. to 220° C. When the main baking temperature is lower than 140° C., depending on the type of solvent, the solvent may not be completely removed. When the solvent remains, the solvent behaves as an impurity, and there is a risk of causing characteristic degradation of the light-emitting elements ES. On the other hand, when the main baking temperature is higher than 220° C., the temperature of the oven is generally less stable, and as a result, it becomes difficult to form a homogeneous film (thermal insulation layer 50).

The addition amount of the polyphenylene sulfide-based resin with respect to the solvent is not particularly limited as long as the addition amount is set, as appropriate, to achieve a desired viscosity of the mixed solution. For example, the content of the polyphenylene sulfide-based resin in the solution is preferably set to be within a range of from 1 wt. % to 30 wt. %, and is more preferably set within a range of from 3 wt. % to 10 wt. %.

The viscosity of the mixed solution is also not particularly limited, but from perspectives such as the ease of stirring the mixed solution and the ease of coating the mixed solution onto an underlayer, the viscosity of the mixed solution is preferably within a range of from 0.1 cP to 20 cP, and more preferably within a range of from 1 cP to 10 cP. In particular, when an ink-jet coating method is used to apply the mixed solution, the viscosity of the mixed solution is preferably in a range of from 1 cP to 10 cP, and more preferably in a range of from 1.5 cP to 8 cP. Note that, instead of an ink-jet method, a spin coating method or the like may be used as the method for applying the mixed solution.

In the step of forming the sealing film 6 of step S5, the thermal insulation layer 50 according to the present embodiment can be formed by using, as an underlayer, the inorganic sealing film 26 covering the cathode 25, and applying the abovementioned mixed solution onto the inorganic sealing film 26 by, for example, ink-jet coating, and then baking.

According to the present embodiment, insulation against external heat entering the light-emitting elements ES can be provided through the sealing film 6 (more specifically, the organic buffer film 27 of the sealing film 6). According to the present embodiment, the thermal insulation layer 50 is formed covering the light-emitting element ES, and thereby insulation against external heat entering the light-emitting element ES from above the light-emitting element ES can be provided.

First Modification

As described above, the sealing film 6 may be formed by repeatedly layering a plurality of layers of the inorganic sealing film and the organic buffer film with the inorganic sealing film sandwiching and sealing the organic buffer film from above and below. Accordingly, the sealing film 6 may have a plurality of thermal insulation layers 50.

Second Embodiment

Figure 4:
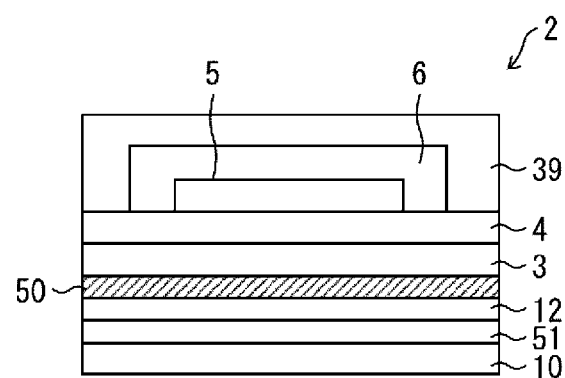
FIG. 4 is a cross-sectional view illustrating a general configuration of a display device according to a second embodiment.

FIG. 4 is a cross-sectional view illustrating a general configuration of the display device 2 according to the present embodiment.

As illustrated in FIG. 4, the thermal insulation layer 50 may be formed at a lower layer side of the TFT layer 4. The display device 2 according to the present embodiment is provided with a thermal insulation layer 50 between a resin layer 12 and a barrier layer 3 (moisture-proof film) covering the resin layer 12 instead of forming the organic buffer film 27 using the thermal insulation layer 50 as in the display device 2 illustrated in FIG. 2. With the exception of this feature, the display device 2 according to the present embodiment is identical to the display device 2 according to the first embodiment.

This type of display device 2 can be formed by forming the resin layer 12 in step S1, and then using the resin layer 12 thereof as the underlayer, and applying the mixed solution containing a polyphenylene sulfide-based resin and a molybdenum complex onto the resin layer 12 through, for example, ink-jet coating, and then baking.

According to the present embodiment, insulation against external heat entering the display device 2 from a lower layer side of the barrier layer 3, that is, from the substrate side, can be provided. In addition, according to the present embodiment, when the display device 2 is, for example, a top-emitting type display device 2, the position of the thermal insulation layer 50 is located on a side opposite a direction of light extraction with respect to the light-emitting element layer 5. Therefore, for example, the film thickness of the thermal insulation layer 50 can be increased. In this way, when the position of the thermal insulation layer 50 is located at the side opposite the light extraction direction with respect to the light-emitting element layer 5, the thermal insulation layer 50 can be formed, for example, with a thickness of 500 nm or greater. As a result, according to the present embodiment, it is possible to further increase the thermal insulation effect of the thermal insulation layer 50. However, when the thickness of the thermal insulation layer 50 exceeds 1000 nm, the feature of being a thin display may be lost. Therefore, the thickness of the thermal insulation layer 50 is preferably not greater than 1000 nm.

First Modification

Figure 5:
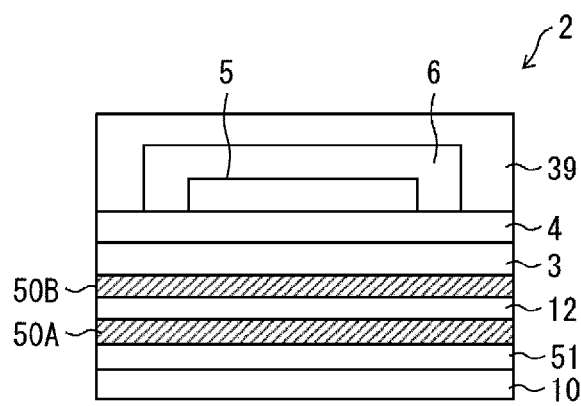
FIG. 5 is a cross-sectional view illustrating a general configuration of a display device according to a first modification of the second embodiment.

FIG. 5 is a cross-sectional view illustrating a general configuration of another display device 2 according to the present embodiment.

Two or more layers of the thermal insulation layer 50 may be provided. In FIG. 5, an example is given for a case in which, as the thermal insulation layer 50, a thermal insulation layer 50A is formed adjacent to the lower face of the resin layer 12, and a thermal insulation layer 50B is formed adjacent to the upper face of the resin layer 12.

Note that the thermal insulation layers 50A and 50B are the same as the thermal insulation layer 50 described above. Accordingly, a description thereof is omitted. When a plurality of thermal insulation layers 50 are provided in the display device 2 as described above, the thicknesses of the thermal insulation layer 50A and the thermal insulation layer 50B may be the same or different.

The display device 2 as illustrated in FIG. 5 can be formed by applying, through an ink-jet method for example, the abovementioned mixed solution containing the molybdenum complex and the polyphenylene sulfide-based resin, which is the material of the thermal insulation layer 50, onto an upper face and a lower face of, for example, a polyimide substrate (resin layer 12) serving as a base substrate, and then removing the solvent.

Second Modification

The thermal insulation layer 50 may also be a base substrate. Therefore, as illustrated in FIG. 4, rather than separately providing the resin layer 12 and the thermal insulation layer 50, the thermal insulation layer 50 may be formed as the resin layer 12 illustrated in FIG. 2. When the base substrate (resin layer 12) also serves as the thermal insulation layer 50, an increase in the number of components of the display device 2 due to the formation of the thermal insulation layer 50 separate from the base substrate (resin layer 12) can be suppressed.

In this case, in step S1, the thermal insulation layer 50 may be formed as the resin layer 12 on a transparent support substrate (for example, mother glass), using the support substrate as an underlayer. As a result, a display device 2 in which the thermal insulation layer 50 is formed as the base substrate (resin layer 12) can be manufactured.

Third Modification

In a case where the display device 2 is not a flexible substrate, the thermal insulation layer 50 may be formed between the substrate such as a glass substrate and the TFT layer 4, for example.

With any of the first to third modifications, insulation against external heat entering the display device 2 from the substrate side can be provided. In addition, with any of the first to third modifications, when the display device 2 is, for example, a top-emitting type display device 2, the position of the thermal insulation layer 50 is located on a side opposite the direction of light extraction with respect to the light-emitting element layer 5, and therefore as described above, the film thickness of the thermal insulation layer 50 can be increased. Thus, in any of the first to third modifications, the thermal insulation effect of the thermal insulation layer 50 can be further increased.

Third Embodiment

Figure 6:
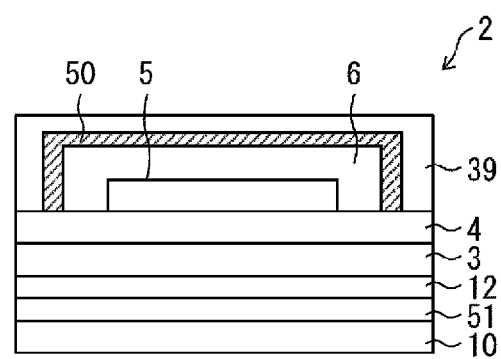
FIG. 6 is a cross-sectional view illustrating a general configuration of a display device according to a third embodiment.

FIG. 6 is a cross-sectional view illustrating a general configuration of the display device 2 according to a third embodiment.

As illustrated in FIG. 6, in the display device 2 according to the present embodiment, a thermal insulation layer 50 is formed on the sealing film 6 to cover the light-emitting element layer 5. With the exception of this feature, the display device 2 according to the present embodiment is identical to the display device 2 according to the first embodiment.

This type of display device 2 can be formed by forming the sealing film 6 in step S5, and then using the sealing film 6 thereof as the underlayer, applying the mixed solution containing a polyphenylene sulfide-based resin and a molybdenum complex onto the sealing film 6 through ink-jet coating for example, and then baking.

According to the present embodiment, insulation against external heat entering the display device 2 from the upper side of the light-emitting elements ES can be provided. In the display device 2 according to the present embodiment, the thermal insulation layer 50 is formed to surround the light-emitting element layer 5, and therefore a temperature stabilizing effect within the light-emitting element layer 5 increases. Therefore, even when the thermal insulation layer 50 has a relatively low film thickness or a relatively low content of the molybdenum complex, within the range indicated in the present embodiment, a thermal insulation effect is easily obtained with the display device 2 according to the present embodiment.

Fourth Embodiment

Figure 7:
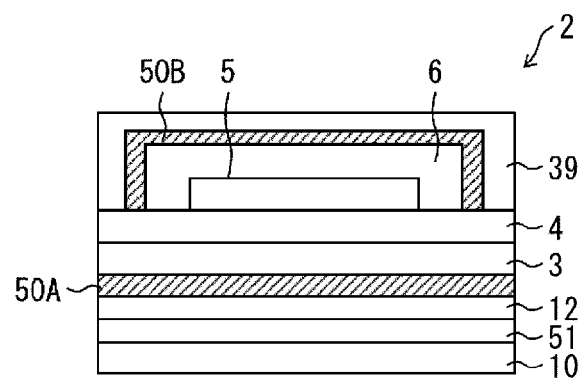
FIG. 7 is a cross-sectional view illustrating a general configuration of a display device according to a fourth embodiment.

FIG. 7 is a cross-sectional view illustrating a general configuration of the display device 2 according to a fourth embodiment.

As illustrated in FIG. 7, the display device 2 according to the present embodiment is identical to the display device 2 according to the first embodiment with the exception that as the thermal insulation layer 50, a thermal insulation layer 50A is formed between the resin layer 12 and the barrier layer 3, and a thermal insulation layer 50B is formed between the sealing film 6 and an upper face film 39.

Note that the thermal insulation layer 50A is the same as the thermal insulation layer 50 according to the second embodiment, and the thermal insulation layer 50B is the same as the thermal insulation layer 50 according to the third embodiment. Accordingly, a description thereof is omitted. Note that in the present embodiment as well, the thickness of the thermal insulation layer 50A and the thermal insulation layer 50B may be the same or different.

The display device 2 according to the present embodiment can provide insulation against external heat entering the display device 2 from a lower layer side of the barrier layer 3, that is, from the substrate side, and can also provide insulation against external heat entering the light-emitting elements ES from above the light-emitting element ES. According to the present embodiment, the thermal insulation layer 50A and the thermal insulation layer 50B are provided with the light-emitting element layer 5 interposed therebetween, and thereby the light-emitting element layer 5 is completely surrounded, and thus a greater thermal insulation effect than that of the first to third embodiments can be obtained.

Fifth Embodiment

Figure 8:
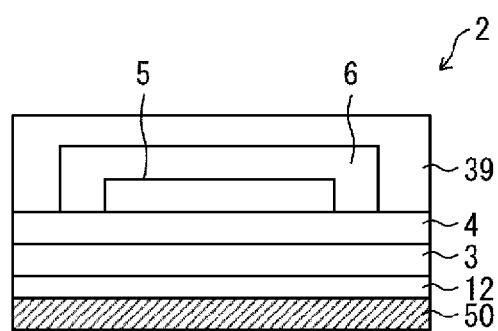
FIG. 8 is a cross-sectional view illustrating a general configuration of a display device according to a fifth embodiment.

FIG. 8 is a cross-sectional view illustrating a general configuration of the display device 2 according to a fifth embodiment.

As illustrated in FIG. 8, in the display device 2 according to the present embodiment, instead of forming the organic buffer film 27 using the thermal insulation layer 50 as in the display device 2 illustrated in FIG. 2, the thermal insulation layer 50 is formed on a side of the resin layer 12, which is the base substrate, the side thereof being opposite the side at which the TFT layer 4 is formed. Note that the thermal insulation layer 50 may also serve as a lower face film 10, or an adhesive layer 51 and the lower face film 10 may be provided on a surface side of the thermal insulation layer 50, the surface side thereof being opposite the resin layer 12.

Such a display device 2 can be formed, for example, by forming the sealing film 6 in step S5, affixing an upper face film 39 to the sealing film 6 in step S6, and peeling the support substrate from the resin layer 12 in step S7, and then subsequently using the resin layer 12 as the underlayer, applying the mixed solution containing the polyphenylene sulfide-based resin and molybdenum complex to the lower face of the resin layer 12 through inkjet coating for example, and then baking.

Through this, during film formation of the thermal insulation layer 50, heat can be avoided during the formation of the sealing film 6. In addition, according to the present embodiment, the thermal insulation layer 50 can provide insulation against external heat entering the display device 2 from a lower layer side of the barrier layer 3, that is, from the substrate side. Furthermore, according to the present embodiment, when the display device 2 is, for example, a top-emitting type display device 2, the position of the thermal insulation layer 50 is located on a side opposite a direction of light extraction with respect to the light-emitting element layer 5. Therefore, in the present embodiment as well, as described with regard to the second embodiment, for example, the film thickness of the thermal insulation layer 50 can be increased.

When, for example, the thermal insulation layer 50 also serves as a lower face film 10, an increase in the number of components of the display device 2 due to the formation of the thermal insulation layer 50 can be suppressed.

Figure 9:
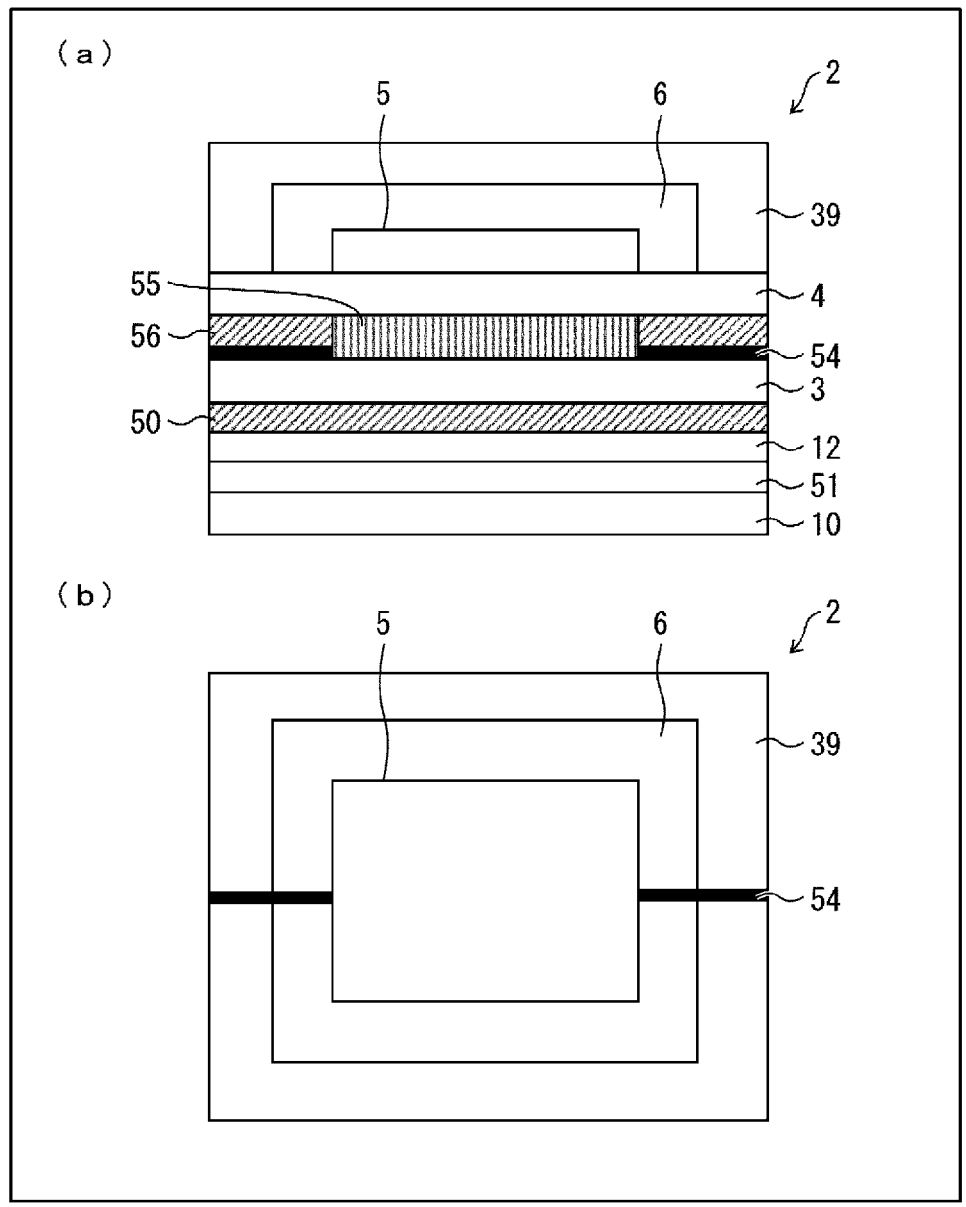
FIG. 9($a$) is a cross-sectional view illustrating a configuration example of a display region of a display device according to a sixth embodiment, and FIG. 9($b$) is a plan view illustrating the configuration of the display device illustrated in FIG. 9($a$).

Sixth Embodiment (a) of FIG. 9 is a cross-sectional view illustrating a configuration example of a display region of a display device 2 according to a sixth embodiment, and (b) of FIG. 9 is a plan view illustrating the configuration of the display device 2 illustrated in (a) of FIG. 9.

As illustrated in (a) of FIG. 9, the display device 2 according to the present embodiment has, as one example, a configuration in which the display device 2 according to the first embodiment is provided with a heat dissipating layer 55 that dissipates heat from the light-emitting element layer 5 to the outside, and a thermal insulation layer 56 surrounding the heat dissipating layer 55 in a plan view. In the present embodiment, the TFT layer 4 is formed between the heat dissipating layer 55 and the light-emitting element layer 5.

The thermal insulation layer 56 is provided in the same layer as the heat dissipating layer 55. The thermal insulation layer 56 may be formed in the same manner as the thermal insulation layer 50. The same material as that of the thermal insulation layer 50 can be used for the thermal insulation layer 56. Note that the same material may be used for the thermal insulation layer 50 and the thermal insulation layer 56, or different materials may be used.

The heat dissipating layer 55 includes a resin and inorganic microparticles dispersed in the resin. Examples of the resin include acrylic resins, polyimides, polyesters, and polyamide resins. Among these, acrylic resins are most preferable from the perspective of heat dissipation. Furthermore, when an acrylic resin is used, a film can be formed by polymerizing the monomer through photopolymerization, and thus handling is convenient also in terms of the process.

The diameter of the inorganic microparticles contained in the resin described above is preferably within a range of from 5 to 100 nm, and more preferably in a range of from 10 to 30 nm. If the diameter of the inorganic microparticles is smaller than 5 nm, there is a risk that a sufficient heat dissipation effect cannot be obtained. On the other hand, when the diameter of the inorganic microparticles is greater than 100 nm, the inorganic microparticles are less likely to disperse in the resin, and the inorganic microparticles may separate in some cases. Furthermore, when inorganic microparticles having a diameter smaller than 5 nm are introduced at a high concentration, aggregation of the inorganic microparticles may occur as a result, and the inorganic microparticles may separate from the resin.

Examples of the inorganic microparticles include at least one type selected from the group consisting of silver, copper, aluminum, magnesium, tin, silicon, and oxides thereof. The inorganic microparticles are easily dispersed in acrylic resins due to the intermolecular force between the inorganic microparticles and the acrylic resin, and as a result, the inorganic microparticles are uniformly dispersed in the acrylic resin, and a heat dissipating layer 55 that exhibits a high heat dissipation effect is obtained. Accordingly, the heat dissipating property of the heat dissipating layer 55 is improved, and the heat dissipating layer 55 functions properly, and as a result, degradation of the light-emitting elements ES caused by heat generated by the light-emitting elements ES or the like can be prevented.

The content of the inorganic microparticles in the heat dissipating layer 55 is preferably from 5 to 40 wt. % relative to the acrylic resin. When the size of the inorganic microparticles is set to the above-mentioned range, induced dipole interaction occurs between the above-described metal having a heat dissipating property and O groups (an ester group, carbonyl group, or ether group) and N groups (amine) contained in the acrylic resin, and therefore a sufficient heat dissipation effect can be obtained, and the inorganic microparticles can be uniformly dispersed in the acrylic resin. Furthermore, on the surface of the aforementioned metal having a heat dissipating property, an oxide film may be formed, and in this case, in particular, miscibility between the O groups contained in the acrylic resin and the metal is particularly improved.

The thickness of the heat dissipating layer 55 is not particularly limited, but is preferably from 20 nm to 1000 nm, and more preferably from 100 nm to 300 nm because heat generated inside the light-emitting element layer 5 is absorbed and the thermal insulation effect is not suppressed.

In addition to the configuration described above, the display device 2 according to the present embodiment is further provided with an extraction wiring line 54 (extraction member) that extracts heat from the heat dissipating layer 55 to the outside. In a plan view (see (b) of FIG. 9), the heat dissipating layer 55 overlaps the light-emitting elements ES. In a plan view, the thermal insulation layer 50 surrounds the periphery of the heat dissipating layer 55. The extraction wiring line 54 is connected to the heat dissipating layer 55 and is formed to overlap the thermal insulation layer 50 in a plan view. By forming the heat dissipating layer 55 to overlap the thermal insulation layer 50, heat can be efficiently dissipated from the heat dissipating layer 55 towards the external environment. Wiring line material similar to wiring line such as the gate wiring line GH and the source wiring line SH can be used for the extraction wiring line 54.

A method of forming the heat dissipating layer 55 will be described with reference to (a) and (b) of FIG. 9 and (a) to (d) of FIG. 10. (a) to (d) of FIG. 10 are cross-sectional views explaining the process for manufacturing the heat dissipating layer 55 in order of the steps.

First, as illustrated in (a) of FIG. 9, similar to the first embodiment, a thermal insulation layer 50 is formed on a resin layer 12, and a barrier layer 3 is formed on the thermal insulation layer 50. Next, as illustrated in (a) and (b) of FIG. 9, an extraction wiring line 54 is formed on the barrier layer 3. Meanwhile, a solution containing a monomer for an acrylic resin and an above-described metal having a heat dissipating property (including a metal oxide containing the metal) is adjusted. An alcohol-based solvent or hexane are commonly used as the solvent. Here, the content of the metal (metal oxide) in the solution is from 5 to 40 wt. % and more preferably from 10 to 20 wt. % relative to the amount of the acrylic monomer.

Figure 10:
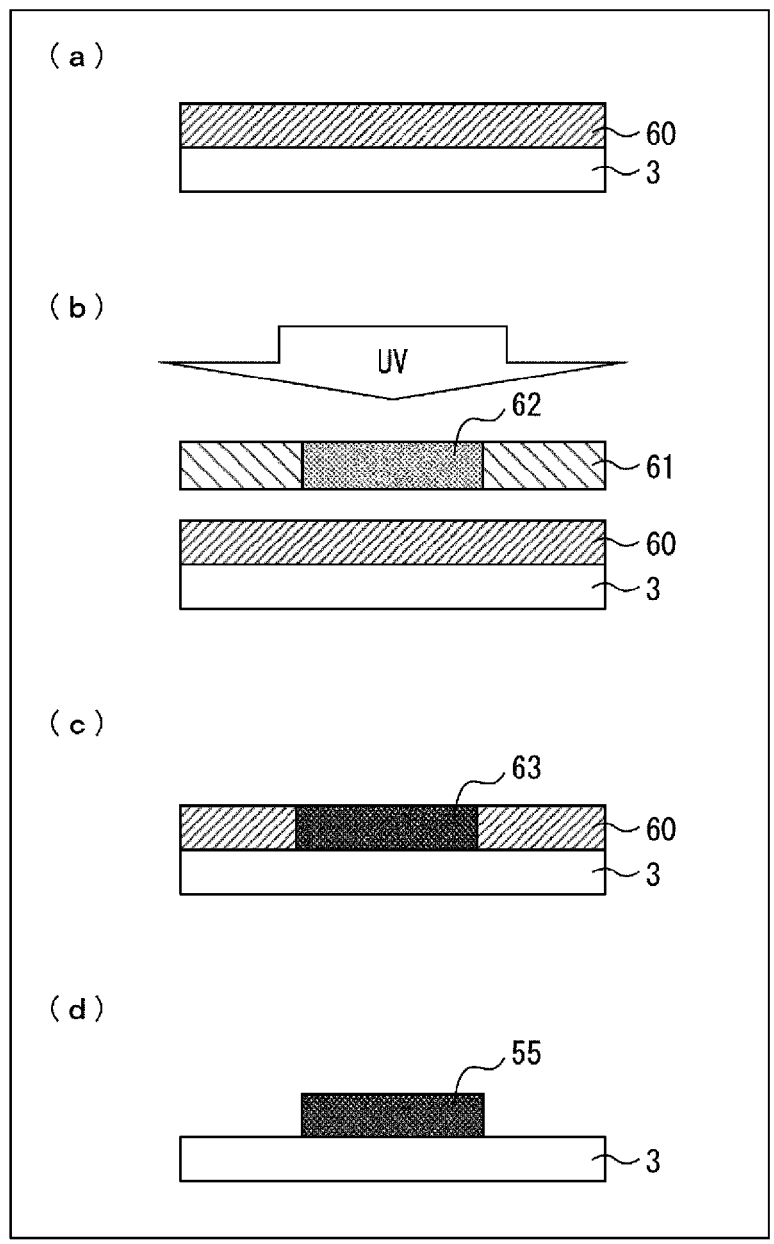
FIGS. 10($a$) to ($d$) are cross-sectional views explaining a process for manufacturing the heat dissipating layer in order of the steps.

Next, the solution is applied onto the barrier layer 3 to form a metal-containing acrylic monomer layer 60 on the barrier layer 3, as illustrated in (a) of FIG. 10. Subsequently, as illustrated in (b) of FIG. 10, the metal-containing acrylic monomer layer 60 is irradiated with UV light through openings 62 of a mask 61. Through this, as illustrated in (c) of FIG. 10, the metal-containing acrylic monomer of a UV light irradiated portion 63 in the metal-containing acrylic monomer layer 60 is photopolymerized, and a metal-containing acrylic resin is formed. Next, as illustrated in (d) of FIG. 10, the unreacted metal-containing acrylic monomers (other portions than the UV light irradiated portion 63 in the metal-containing acrylic monomer layer 60) are washed off with a solvent such as an alcohol or hexane. Through this, a heat dissipating layer 55 that remains on the barrier layer 3 and is formed from the metal-containing acrylic resin of the UV light irradiated portion 63 is obtained.

Note that the method of forming the heat dissipating layer 55 is not limited to the method described above, and for example, a method of adhering a film, or a method of forming a film through coating may be used.

Examples

The effects of the thermal insulation layer 50 will be described below using examples and comparative examples. However, the following examples are merely examples of the embodiments described above, and the embodiments described above are not limited to the following examples.

Using OLED elements (organic EL elements) as light-emitting elements ES, verification tests of the degradation (decrease in brightness) of the organic EL elements were conducted, and the results obtained thereby are described below.

Example 1

First, the molybdenum complex [$MoFe_3S_6(CH_3)_5$] was added at a ratio of 3 wt. % with respect to the poly(p-phenylene sulfide) to an NMP solution containing, at a ratio of 5 wt. %, poly(p-phenylene sulfide) represented by structural formula (1) and mixed well, and thereby a mixed solution containing the poly(p-phenylene sulfide) and [$MoFe_3S_6(CH_3)_5$] was prepared.

Next, as described with regard to the first modification of the second embodiment, this mixed solution was applied by an ink-jet method to an upper face and a lower face of the exterior of the polyimide substrate (resin layer 12) on which the OLED elements were to be mounted, and then baked, and dried, and thereby the display device 2 illustrated in FIG. 5 was formed.

A reduction in the brightness characteristic of the OLED elements of the display device 2 was tracked through an operating test at 70° C., and the time (hereinafter, referred to as the "degradation time") for the brightness to decrease to 90% with respect to the initial brightness of the OLED element was measured.

Example 2

In Example 2, a display device 2 was formed under the same conditions as in Example 1 with the exception that the addition amount of $[MoFe_3S_6(CH_3)_5]$ with respect to the poly(p-phenylene sulfide) was changed to 7 wt. %, and the degradation time was measured by the same method as in Example 1.

Example 3

In Example 3, a display device 2 was formed under the same conditions as in Example 1 with the exception that the addition amount of $[MoFe_3S_6(CH_3)_5]$ with respect to the poly(p-phenylene sulfide) was changed to 1 wt. %, and the degradation time was measured by the same method as in Example 1.

Example 4

In Example 4, a display device 2 was formed under the same conditions as in Example 1 with the exception that the addition amount of $[MoFe_3S_6(CH_3)_5]$ with respect to the poly(p-phenylene sulfide) was changed to 10 wt. %, and the degradation time was measured by the same method as in Example 1.

Comparative Example 1

In Comparative Example 1, a display device 2 for comparison was formed under the same conditions as in Example 1 with the exception that the molybdenum complex used in Example 1 was not added to the poly(p-phenylene sulfide) (that is, the addition amount of the molybdenum complex was zero), and the thermal insulation layer 50 was formed only of the poly(p-phenylene sulfide). The degradation time was measured by the same method as in Example 1.

Comparative Example 2

In Comparative Example 2, a display device 2 for comparison was formed under the same conditions as in Example 1 with the exception that in place of the molybdenum complex added to the poly (p-phenylene sulfide) in Example 1, simple molybdenum microparticles were added to the poly(p-phenylene sulfide) at a ratio of 5 wt. %. The degradation time was measured by the same method as in Example 1.

Comparative Example 3

In Comparative Example 3, a display device 2 for comparison was formed under the same conditions as in Example 1 with the exception that the thermal insulation layer 50 was not formed. The degradation time was measured by the same method as in Example 1.

The degradation times measured in Examples 1 to 4 and Comparative Examples 1 to 3 are summarized in Table 1.

TABLE 1

| | Degradation Time (h) |
|---|---|
| Example 1 | 116 |
| Example 2 | 148 |
| Example 3 | 89 |
| Example 4 | 156 (However, the initial luminance itself decreased due to scattering.) |
| Comparative Example 1 | 88 |
| Comparative Example 2 | 83 |
| Comparative Example 3 | 80 |

Example 5

In Example 5, a display device 2 for comparison was formed under the same conditions as in Example 1 with the exception that as the polyphenylene sulfide-based resin, a dodecyl group-containing poly(p-phenylene sulfide) containing a dodecyl group as an alkyl group in the structural formula (2) was used in place of the poly(p-phenylene sulfide) represented by structural formula (1), and $[MoFe_2S_5(CH_3)_5]$ was used as the molybdenum complex in place of the $[MoFe_3S_6(CH_3)_5]$. The degradation time was measured by the same method as in Example 1.

Example 6

In Example 6, a display device 2 was formed under the same conditions as in Example 5 with the exception that the addition amount of the $[MoFe_2S_5(CH_3)_5]$ with respect to the dodecyl group-containing poly(p-phenylene sulfide) was changed to 7 wt. %. The degradation time was measured by the same method as in Example 1.

Example 7

In Example 7, a display device 2 was formed under the same conditions as in Example 5 with the exception that the addition amount of the $[MoFe_2S_5(CH_3)_5]$ with respect to the dodecyl group-containing poly(p-phenylene sulfide) was changed to 1 wt. %. The degradation time was measured by the same method as in Example 1.

Example 8

In Example 8, a display device 2 was formed under the same conditions as in Example 5 with the exception that the addition amount of $[MoFe_2S_5(CH_3)_5]$ with respect to the dodecyl group-containing poly(p-phenylene sulfide) was changed to 10 wt. %. The degradation time was measured by the same method as in Example 1.

Comparative Example 4

In Comparative Example 4, a display device 2 for comparison was formed under the same conditions as in Example 5 with the exception that the molybdenum complex—was not added to the dodecyl group-containing poly (p-phenylene sulfide) (that is, the addition amount of the molybdenum complex was zero), and the thermal insulation layer 50 was formed only of the dodecyl group-containing poly(p-phenylene sulfide). The degradation time was measured by the same method as in Example 1.

Comparative Example 5

In Comparative Example 5, a display device 2 for comparison was formed under the same conditions as in Example 5 with the exception that in place of the molybdenum complex added to the dodecyl group-containing poly(p-phenylene sulfide), simple molybdenum microparticles were added to the dodecyl group-containing poly(p-phenylene sulfide) at a ratio of 5 wt. %. The degradation time was measured by the same method as in Example 1.

The degradation times measured in Examples 5 to 8 and Comparative Examples 4 and 5 are summarized in Table 2.

TABLE 2

|  | Degradation Time (h) |
| --- | --- |
| Example 5 | 150 |
| Example 6 | 163 |
| Example 7 | 96 |
| Example 8 | 169 (However, the initial luminance itself decreased due to scattering.) |
| Comparative Example 3 | 93 |
| Comparative Example 4 | 84 |

From the results shown in Table 1 and Table 2, it is clear that by forming the thermal insulation layer 50 including the polyphenylene sulfide-based resin and the molybdenum complex, degradation of the light-emitting elements ES (OLED elements) can be retarded compared to the case where the thermal insulation layer 50 is not formed as in Comparative Example 3. Furthermore, from the results shown in Table 1 and Table 2, when a comparison is made between display devices 2 in which the same materials were used, it is clear that by forming the thermal insulation layer 50 including the polyphenylene sulfide-based resin and the molybdenum complex, degradation of the light-emitting element elements ES (OLED elements) can be retarded even compared to the case in which the molybdenum complex was not used as in Comparative Examples 1 and 4, and the case in which molybdenum microparticles were used alone as in Comparative Examples 2 and 5. Furthermore, from the results shown in Examples 1 to 8, it is also clear that when the addition amount of molybdenum complex with respect to the polyphenylene sulfide-based resin is within a range of from 3 wt. % to 7 wt. %, the thermal insulation effect is increased, and compared to a case where the addition amount of the molybdenum complex is outside the range described above, degradation of the light-emitting elements ES can be retarded dramatically, and a decrease in the display characteristics due to effects such as scattering can be avoided.

Furthermore, from the results shown in Comparative Examples 2 and 5, it can be inferred that when molybdenum is used as a single metal rather than a complex, a sufficient thermal insulation effect was not obtained due to aggregation of the molybdenum. For example, inorganic microparticles (metal microparticles) such as molybdenum, tungsten, and tantalum have an endothermic property, and as such, these inorganic microparticles have a thermal insulation effect. However, as a result of diligent research by the inventors of the present application, it was found that even if a single metal is dispersed in the resin in a trace amount such that coloring or scattering does not occur, the metal is not uniformly dispersed and is unevenly distributed in the resin. As a result, the thermal insulation effect is not sufficiently exhibited.

Furthermore, as a result of diligent research by the inventors of the present application, it was found that when the thermal insulation layer 50 is formed only from a molybdenum complex, the decrease in transmittance is significant, and the display performance is greatly impaired. On the other hand, when, for example, the addition amount of molybdenum complex with respect to the polyphenylene sulfide-based resin is within a range of from 3 wt. % to 7 wt. % as described above, transmittance of 95% or higher based on an air transmittance of 100% can be ensured.

As described above, according to the present embodiment, a display device 2 capable of retarding the degradation of the light-emitting elements ES by insulating the light-emitting elements ES from external heat (suppressing heat conduction) can be provided.

The disclosure is not limited to each of the embodiments and examples described above, and various modifications may be made within the scope of the claims. For example, embodiments obtained by appropriately combining technical approaches disclosed in each of the different embodiments also fall within the technical scope of the disclosure. Furthermore, novel technical features can be formed by combining the technical approaches disclosed in the embodiments.

Supplement

A display device according to a first aspect of the disclosure includes: a light-emitting element layer provided with a plurality of light-emitting elements; and a TFT layer provided below the light-emitting element layer and including TFT configured to drive the plurality of light-emitting elements; wherein at least one thermal insulation layer configured to thermally insulate the plurality of light-emitting elements from external heat is provided, and the thermal insulation layer includes a molybdenum-containing complex and a polyphenylene sulfide-based resin.

In a display device according to a second aspect of the disclosure, the complex in the display device of the first aspect may contain sulfur in a ligand.

In a display device according to a third aspect of the disclosure, in the first aspect or second aspect, a content percentage of the complex with respect to the polyphenylene sulfide-based resin in the thermal insulation layer may be from 3 to 7 wt. %.

In a display device according to a fourth aspect of the disclosure, the thermal insulation layer in any of the first to third aspects may be formed covering the light-emitting element layer.

In a display device according to a fifth aspect of the disclosure, in any one of the first to fourth aspects, the thermal insulation layer may be an organic insulating layer, and a sealing film configured to seal the light-emitting element layer, including the thermal insulation layer, may be provided, and the sealing film may include a structure in which a first inorganic insulating layer, the thermal insulation layer, and a second inorganic insulating layer are layered in this order from the light-emitting element layer side.

In a display device according to a sixth aspect of the disclosure, the display device in any one of the first to fourth aspects may include a sealing film configured to seal the light-emitting element layer, and the thermal insulation layer may cover the sealing film.

In a display device according to a seventh aspect of the disclosure, the thermal insulation layer in any of the first to sixth aspects may be formed at a lower layer side of the TFT layer.

In a display device according to an eighth aspect of the disclosure, in any one of the first to seventh aspects, a resin layer and a moisture-proof film covering the resin layer may be provided at a lower layer side of the TFT layer, and the thermal insulation layer may be provided between the resin layer and the moisture-proof film.

In a display device according to a ninth aspect of the disclosure, in any one of the first to seventh aspects, a resin layer may be provided at a lower layer side of the TFT layer, and the thermal insulation layer may be provided at a lower layer side of the resin layer.

In a display device according to a tenth aspect of the disclosure, in any one of the first to ninth aspects, a heat dissipating layer configured to dissipate heat from the plurality of light-emitting elements may be provided, and the TFT layer may be formed between the heat dissipating layer and the light-emitting element layer.

In a display device according to an eleventh aspect of the disclosure, in the tenth aspect, an extraction member configured to extract the heat to the outside may be connected to the heat dissipating layer, and in a plan view, the heat dissipating layer may overlap the plurality of light-emitting elements, the thermal insulation layer may surround a periphery of the heat dissipating layer, and the extraction member may be formed overlapping the thermal insulation layer.

In a display device according to a twelfth aspect of the disclosure, the heat dissipating layer in the tenth or eleventh aspect may be made from a material including an acrylic resin in which inorganic microparticles are dispersed.

In a display device according to a thirteenth aspect of the disclosure, the inorganic microparticles in the twelfth aspect may be at least one type selected from the group consisting of silver, copper, aluminum, magnesium, tin, silicon, and oxides thereof.

In a display device according to a fourteenth aspect of the disclosure, in the twelfth or thirteenth aspect, the content of the inorganic microparticles contained in the material of the heat dissipating layer may be from 5 to 40 wt. % relative to the acrylic resin.

The invention claimed is:

1. A display device comprising:
a light-emitting element layer provided with a plurality of light-emitting elements;
a thin-film transistor (TFT) layer provided below the light-emitting element layer and including one or more TFTs configured to drive the plurality of light-emitting elements;
at least one thermal insulation layer configured to thermally insulate the plurality of light-emitting elements from external heat, wherein the at least one thermal insulation layer comprises a molybdenum-containing complex and a polyphenylene sulfide-based resin;
a heat dissipating layer configured to dissipate heat from the plurality of light-emitting elements, wherein the TFT layer is formed between the heat dissipating layer and the light-emitting element layer; and
an extraction member connected to the heat dissipating layer and configured to extract the heat to outside of the display device, wherein in a plan view,
the heat dissipating layer overlaps the plurality of light-emitting elements,
the at least one thermal insulation layer surrounds a periphery of the heat dissipating layer, and
the extraction member is formed overlapping the at least one thermal insulation layer.

2. The display device according to claim 1,
wherein the molybdenum-containing complex comprises sulfur in a ligand.

3. The display device according to claim 1,
wherein a content percentage of the molybdenum-containing complex with respect to the polyphenylene sulfide-based resin in the at least one thermal insulation layer is from 3 to 7 wt. %.

4. The display device according to claim 1,
wherein the a first thermal insulation layer is formed covering the light-emitting element layer.

5. The display device according to claim 1, further comprising a sealing film and the first thermal insulation layer,
wherein the first thermal insulation layer is an organic insulating layer,
the sealing film is configured to seal the light-emitting element layer and the first thermal insulation layer, and
the sealing film includes a structure in which a first inorganic insulating layer, the first thermal insulation layer, and a second inorganic insulating layer are layered in this order from a light-emitting element layer side.

6. The display device according to claim 1,
further comprising a sealing film configured to seal the light-emitting element layer,
wherein a second thermal insulation layer covers the sealing film.

7. The display device according to claim 1,
wherein a third thermal insulation layer is formed at a lower layer side of the TFT layer.

8. The display device according to claim 1,
wherein a resin layer and a moisture-proof film covering the resin layer are provided at a lower layer side of the TFT layer, and
a fourth thermal insulation layer is provided between the resin layer and the moisture-proof film.

9. The display device according to claim 1,
wherein a resin layer is provided at a lower layer side of the TFT layer, and
a fifth thermal insulation layer is provided at a lower layer side of the resin layer.

10. The display device according to claim 1,
wherein the heat dissipating layer comprises a material including an acrylic resin in which inorganic microparticles are dispersed.

11. The display device according to claim 10,
wherein the inorganic microparticles are at least one type selected from the group consisting of silver, copper, aluminum, magnesium, tin, silicon, and oxides thereof.

12. The display device according to claim 10,
wherein a content of the inorganic microparticles contained in the material of the heat dissipating layer is from 5 to 40 wt. % relative to the acrylic resin.

* * * * *

UNITED STATES PATENT AND TRADEMARK OFFICE
CERTIFICATE OF CORRECTION

PATENT NO. : 11,917,858 B2
APPLICATION NO. : 17/272649
DATED : February 27, 2024
INVENTOR(S) : Masanobu Mizusaki It is certified that error appears in the above-identified patent and that said Letters Patent is hereby corrected as shown below:

On the Title Page

Please replace item (54) and in the Specification Column 1, Lines 1-4 with the following:
(54) DISPLAY DEVICE INCLUDING MOLYBDENUM AND POLYPHENYLENE SULFIDE CONTAINING THERMAL INSULATION LAYER Signed and Sealed this
Ninth Day of April, 2024

Katherine Kelly Vidal
Director of the United States Patent and Trademark Office